(12) United States Patent
Grady et al.

(10) Patent No.: US 7,589,974 B2
(45) Date of Patent: Sep. 15, 2009

(54) MODULAR SERVER AND METHOD

(75) Inventors: John R. Grady, Houston, TX (US); Jeffery M. Giardina, Houston, TX (US); Aaron M. Albaugh, Houston, TX (US)

(73) Assignee: Helwett-Packard Development Company, L.P., Houston, TX (US)

( * ) Notice: Subject to any disclaimer, the term of this patent is extended or adjusted under 35 U.S.C. 154(b) by 602 days.

(21) Appl. No.: 11/408,859

(22) Filed: Apr. 21, 2006

(65) Prior Publication Data

US 2007/0247826 A1 Oct. 25, 2007

(51) Int. Cl.
*H05K 7/10* (2006.01)
(52) U.S. Cl. ............. 361/735; 361/796; 361/729; 174/520; 439/74; 710/301
(58) Field of Classification Search ............. 361/735, 361/728–731, 752, 796; 439/74, 76.1; 174/520, 174/50
See application file for complete search history.

(56) References Cited

U.S. PATENT DOCUMENTS

| | | | |
|---|---|---|---|
| 3,267,334 A * | 8/1966 | Wulc ..................... 361/735 |
| 3,299,403 A * | 1/1967 | Young ..................... 375/237 |
| 5,645,434 A * | 7/1997 | Leung ..................... 439/74 |
| 5,675,553 A * | 10/1997 | O'Brien et al. ............. 367/135 |
| 5,676,553 A * | 10/1997 | Leung ..................... 439/74 |
| 6,036,505 A * | 3/2000 | Zell et al. ................. 439/74 |
| 6,477,055 B1 | 11/2002 | Bolognia et al. |
| 6,556,438 B1 | 4/2003 | Bolognia et al. |
| 6,666,340 B2 | 12/2003 | Basinger et al. |
| 6,754,084 B1 | 6/2004 | Bolognia et al. |
| 6,791,843 B1 * | 9/2004 | Dobbs et al. ............... 361/758 |
| 7,184,272 B1 * | 2/2007 | Harlacher et al. ........... 361/729 |
| 2002/0080541 A1 | 6/2002 | Bunker et al. |
| 2005/0254210 A1 | 11/2005 | Grady et al. |
| 2005/0259393 A1 | 11/2005 | Vinson et al. |
| 2005/0260944 A1 | 11/2005 | Vinson et al. |

* cited by examiner

*Primary Examiner*—Dameon E Levi

(57) ABSTRACT

A modular computer system is provided. In one embodiment, the system includes a computer server having a first printed circuit assembly disposed within a first housing and an expansion connector. The computer server is configured to be coupled to a modular expansion unit via the expansion connector to convert the computer server from a base configuration to an expanded configuration. In various embodiments, the expanded configuration may provide additional processing power, additional memory, or the like. A method of assembling a modular computer system is also provided.

18 Claims, 11 Drawing Sheets

MODULAR SERVER AND METHOD

BACKGROUND

This section is intended to introduce the reader to various aspects of art, which may be related to various aspects of the present subject matter described and/or claimed below. The discussion is believed to be helpful in providing the reader with background information to facilitate a better understanding of the various aspects of the present subject matter. Accordingly, it should be understood that these statements are to be read in this light, and not as admissions of prior art.

Computer servers are used by a wide array of users, which range from individual users hosting a website to large corporations that depend on a multitude of such systems in day-to-day operations. While a particular server may initially satisfy the requirements or performance desired by a user, the requirements or desires of that user may change over time. For instance, newer applications may be developed that consume more computing resources. Alternatively, in the case of an organization or website, a system administrator may need to increase the memory capacity and the processing power of a system to accommodate additional users or visitors. While certain individual components of the server may be replaced with more powerful components, this process is inefficient and may be insufficient to fully meet the increased performance demands. In such cases, a user often must resort to purchasing a new server to satisfy the new requirements or to meet the desired performance metric.

BRIEF DESCRIPTION OF THE DRAWINGS

Advantages of one or more disclosed embodiments may become apparent upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in greater detail below, one or more embodiments of the present techniques provide a novel modular system for upgrading an existing server to a server featuring additional or enhanced capabilities. In one embodiment, an expansion chassis and printed circuit assembly are coupled to an existing blade server to increase the memory and processing power of the server. However, upon reading the following description, it will be apparent that the disclosed expansion techniques may be generally used to extend the capabilities of an existing electrical device, including blade servers and other servers. This modularity increases the scalability of such devices, offering additional opportunities and upgrade paths. Further, as the upgraded server utilizes the existing server, a number of components are common to both configurations, which may reduce inventory requirements and material costs for device manufacturers.

Figure 1:
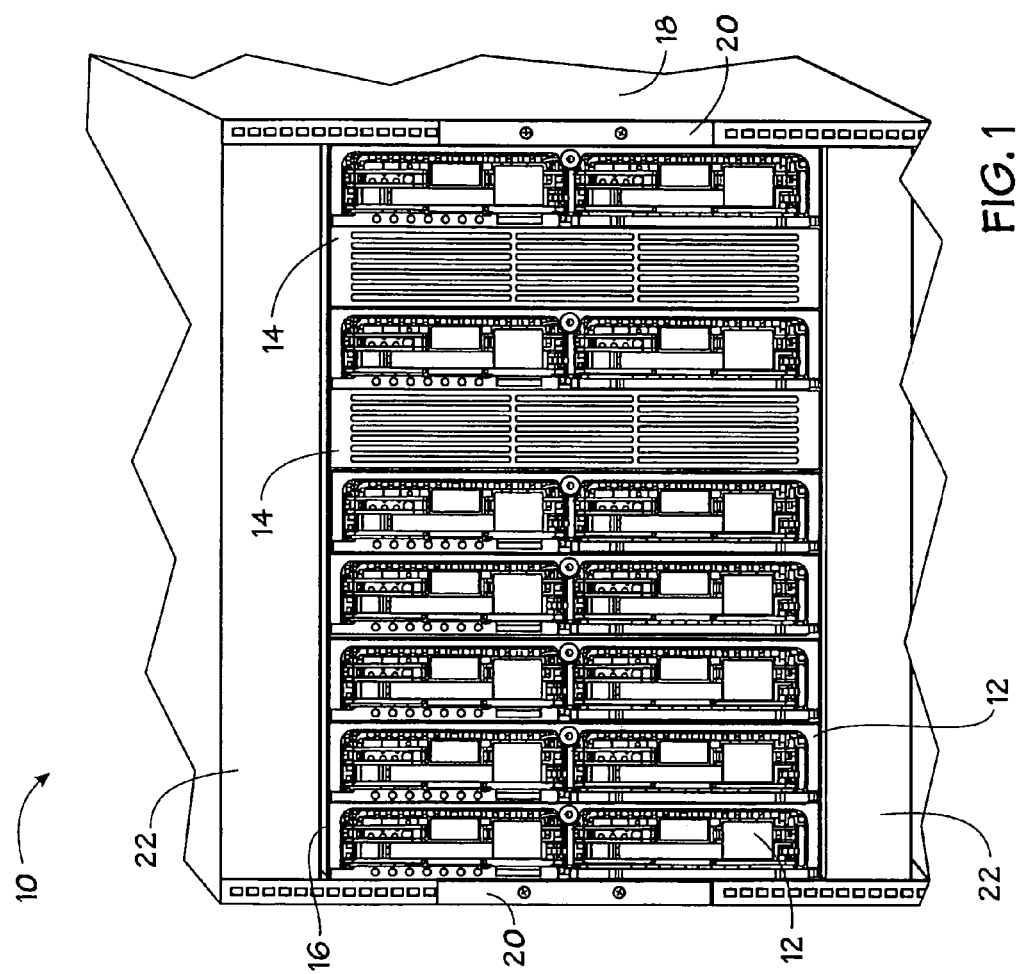
FIG. 1 is a perspective view illustrating a rack mount system having a plurality of modular computer servers in accordance with one embodiment of the present invention.

Turning now to the figures, an exemplary rack mount system 10 is illustrated in FIG. 1 in accordance with one embodiment of the present invention. In the illustrated embodiment, rack mount system 10 includes a number of computer servers 12 and 14 disposed within a cabinet or enclosure 16, which may include a common backplane to provide power to, and facilitate communication with, the servers 12 and 14. In turn, the cabinet 16 is disposed in a rack structure or housing 18 and mounted thereto via mounting brackets 20. As discussed in greater detail below, servers 12 and 14 are modular, in that additional components may be externally mounted to a server 12 to convert or upgrade the server 12 to a server 14. Additionally, other components 22 may also be disposed in the rack structure 18 in accordance with the present techniques. As will be appreciated, other components 22 may include additional computer servers, power supplies, operator interfaces, and the like. It should also be noted that the rack housing 18 may have any number and configuration of rack mount receptacles having supports, such as a manual or automatic rail mechanisms, that support the servers 12 and 14, the cabinet 16, or the various components 22.

Figure 2:
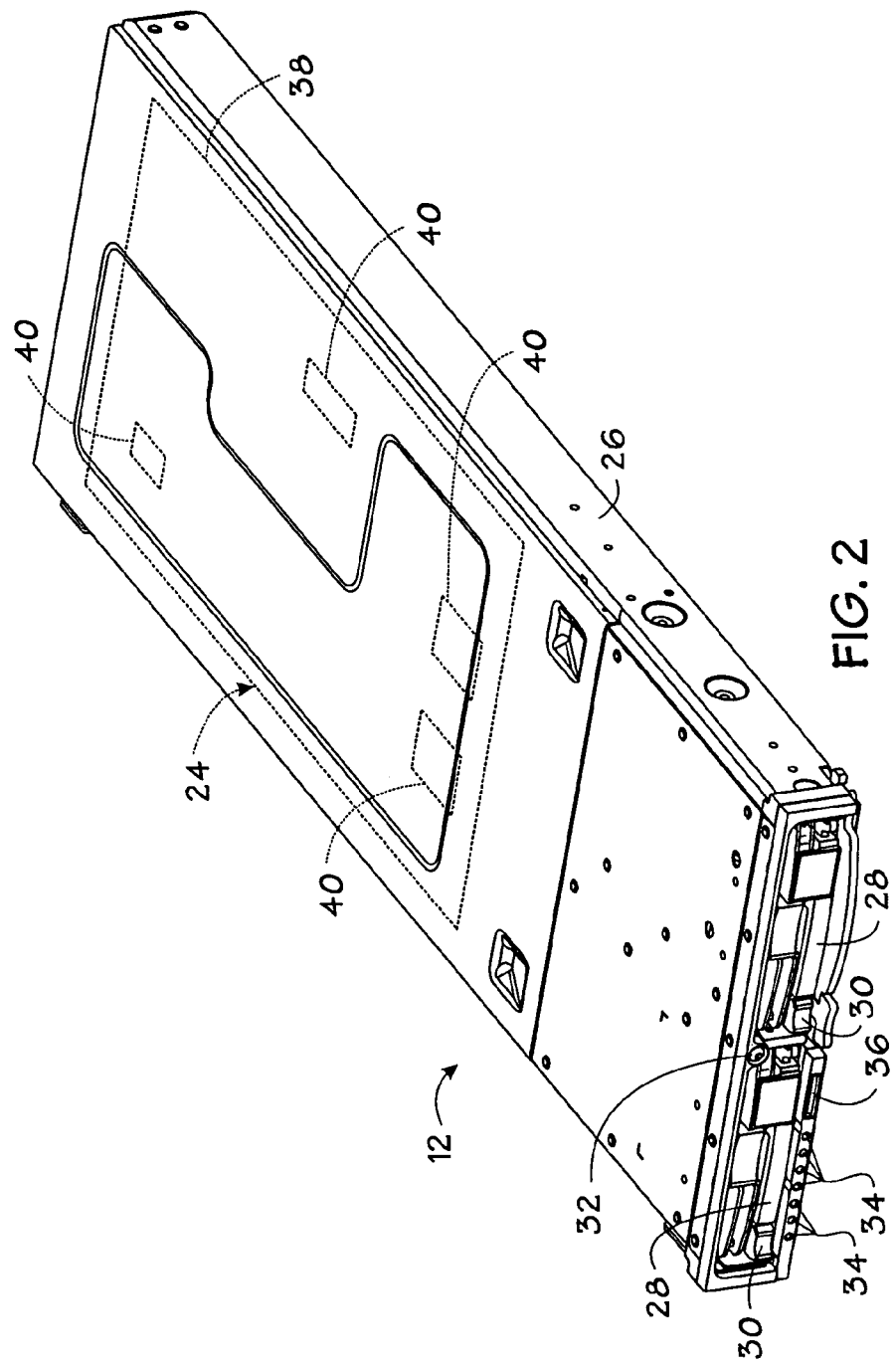
FIG. 2 is a perspective view of a modular computer server in a base configuration in accordance with one embodiment of the present invention.

An exemplary blade server 12 is illustrated in FIG. 2. It should be noted that, although the exemplary server 12 is illustrated as a blade server, the disclosed expansion techniques are generally applicable to electronic devices other than blade servers, including non-blade computer servers. The exemplary blade server 12 includes a printed circuit assembly (PCA) 24 disposed in an enclosure or housing 26. In one embodiment, the server 12 includes hard disk drives 28 that are hot-swappable, i.e. may be removed and installed during operation of the server 12, and may be disengaged from the server 12 via release levers 30.

The exemplary server 12 may also include a variety of other components, including a power button 32, one or more LEDs 34, and a diagnostic port 36. The LEDs 34 may comprise various indicator lights related to the server 12 or the status thereof, including providing unit identification, power status, standby status, health status, operation of a network interface card (NIC), or other such characteristics. Other components of the server 12 may be disposed internally within the housing 26, such as a printed circuit board (PCB) 38 of the PCA 24. The PCA 24 may also include a variety of components 40 coupled to the PCB 38, such as one or more processors (which may be single-core or multi-core processors), volatile or non-volatile memory devices, a duel-port fibre channel adapter, one or more NICs, and various controllers, to name but a few.

Figure 3:
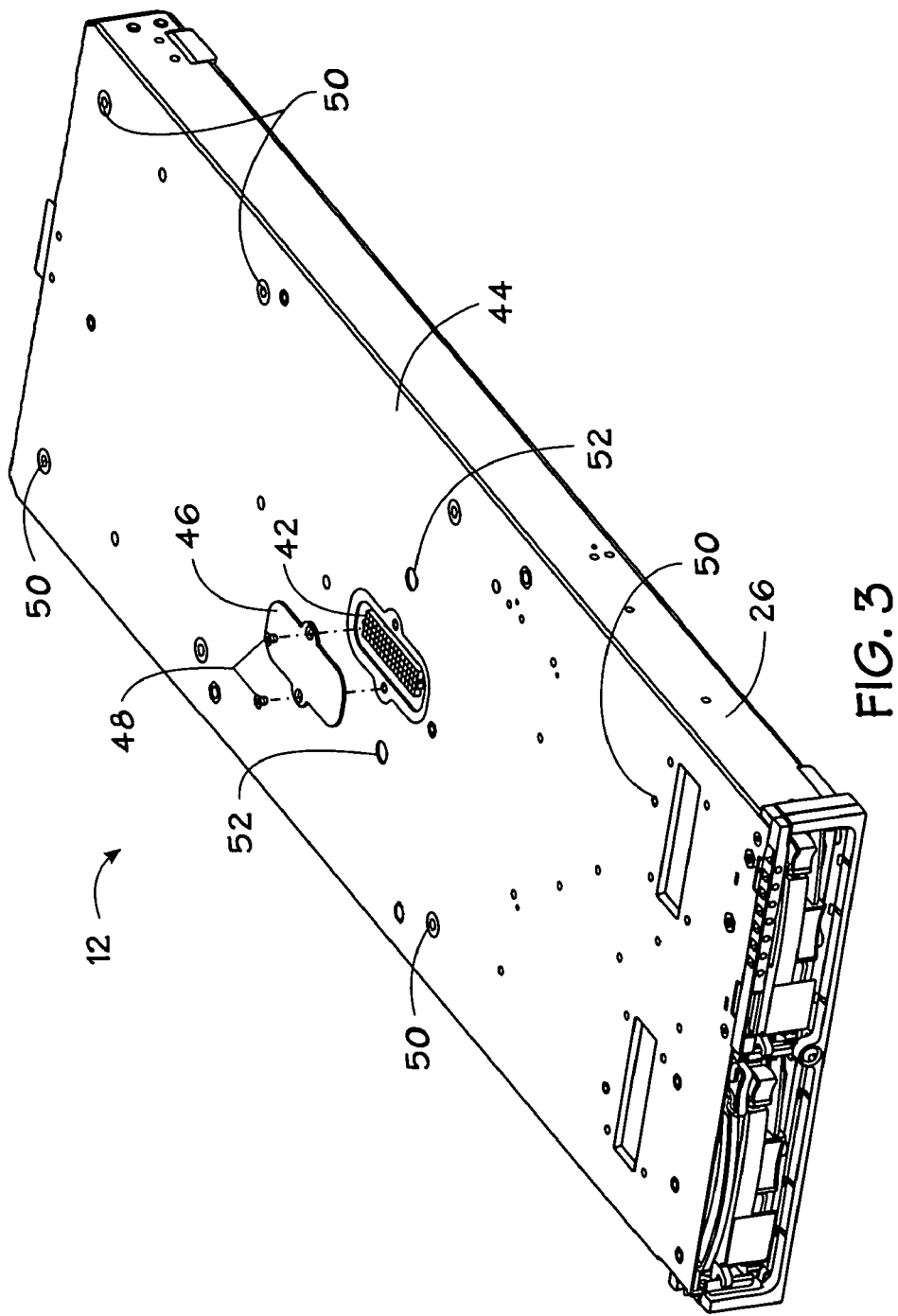
FIG. 3 is a lower perspective view of the modular computer server illustrated in FIG. 2 and depicts an expansion port and a removable cover in accordance with one embodiment of the present invention.

The underside of the exemplary server 12 is illustrated in FIG. 3. An expansion port or scalability connector 42 is coupled to the PCA 24 (FIG. 2) to provide expansion opportunities. Particularly, as discussed in greater detail below, connector 42 enables the connection of additional electronic components to the server 12 to provide additional or enhanced features or capabilities. For instance, the connector 42 facilitates the connection of an additional circuit assembly, such as PCA 82 (FIG. 6), which may include additional processors or memory devices, to the PCA 24 of the server 12 to enhance or increase the processing power or memory capacity of the server 12. In such an arrangement, the connector 42 facilitates communication between the PCA 24 and the additional circuit assembly. In one embodiment, the server 12 is configured to operate alone when the connector 42 is not being utilized, and to operate in conjunction with an additional circuit assembly as an integrated unit when the additional circuit assembly is coupled to the connector 42, as discussed in detail below.

In the presently illustrated embodiment, the connector 42 is a female connector configured to receive a multi-pin male connector, such as the connector 102 discussed below. Other embodiments, however, the connectors 42 and 102 may have different configurations or genders. For instance, in one embodiment, the connector 42 may be a male connector configured to mate with a female connector 102. Additionally, in various embodiments, the connectors 42 and 102 may include straight-in or ninety-degree connectors, card edge connectors, connectors having various pin arrangements, connectors that have locking features, sliding connectors, or any number of other suitable connectors.

The scalability connector 42 is provided adjacent a side 44 of the housing 26. A removable cover 46 may be secured to the side 44, over the connector 42, via screws 48. Thus, the cover 46 protects the connector 42 when installed on side 44, such as when the server 12 is in a base, i.e. non-expanded, configuration. In turn, the cover 46 may be selectively removed to expose the connector 42 and permit external expansion of the server 12. In other embodiments, the cover 46 may have different configurations, such as a hinged cover or a sliding cover that may be selectively positioned to either cover or expose the connector 42. Further, in one embodiment, the cover 46 may be a spring-biased door configured to automatically open as a device is moved into engagement with the connector 42 and automatically close when the connector 42 is uncoupled from the device.

It should be noted that, as used herein, the terms "base" configuration and "extended" or "expanded" configurations merely refer to the exclusion or addition of an expansion chassis and related components to an external side of the server 12, as noted above and discussed in greater detail below. These terms are not intended to describe the internal components of either the server 12 or the server 14. As will be appreciated, the computer servers 12 and 14 may include any of a number of various components, including processors, memory devices, controllers, risers, power supplies, hard drives, and input-output devices, for example, that may be installed or removed from the servers 12 and 14 in full accordance with the disclosed techniques.

Figure 4:
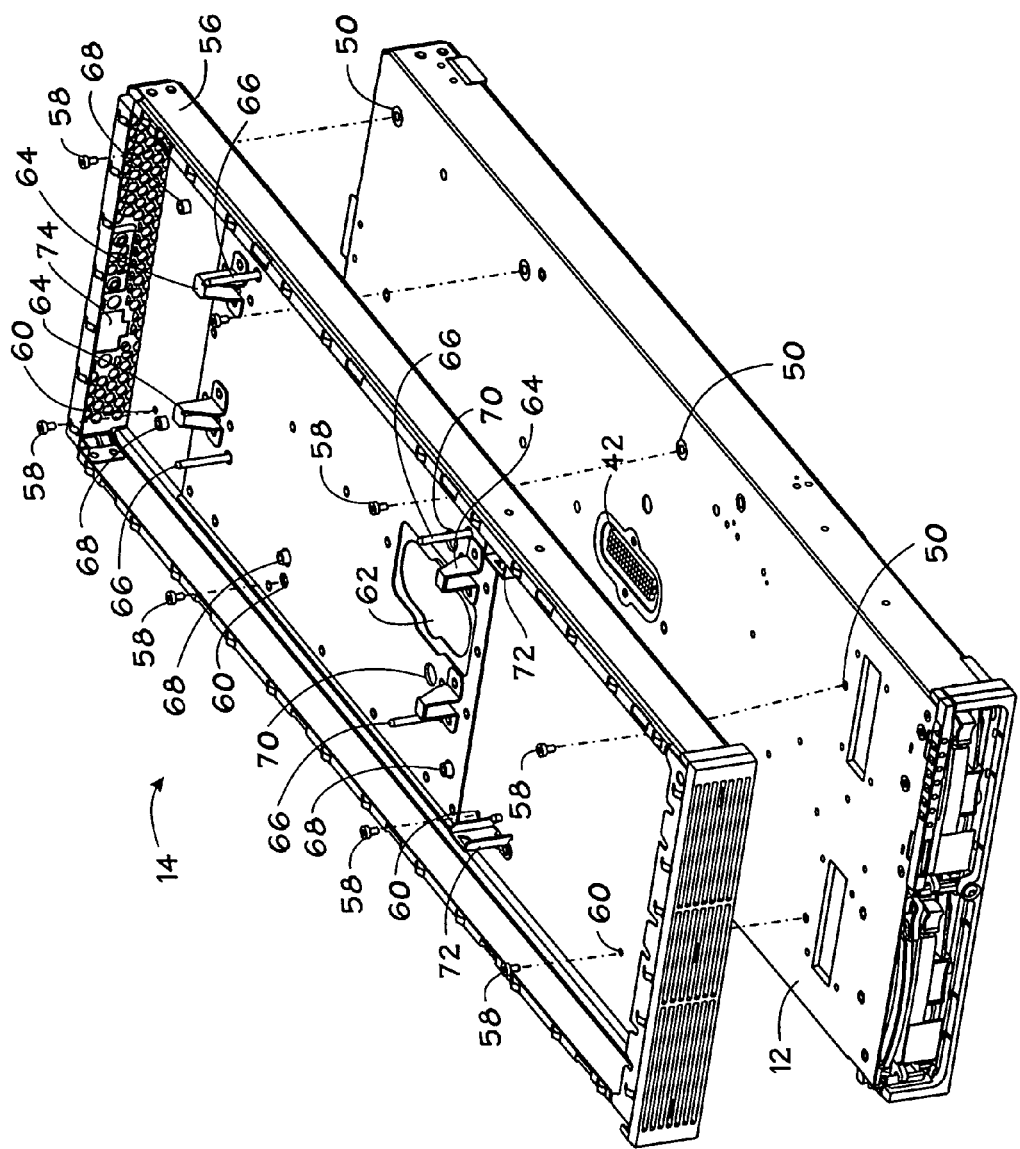
FIG. 4 is an exploded view illustrating certain features of an expansion chassis and the mounting of the chassis to the housing of the computer server depicted in FIG. 3 in accordance with one embodiment of the present invention.

The server 12 includes various features to facilitate mounting of an expansion housing or chassis 56 (FIG. 4) to the server 12. For instance, in one embodiment, the server 12 includes mounting and alignment features, such as clinch nuts 50 and apertures 52. These features of the server 12 may be configured to cooperate with corresponding features of the chassis 56 or other components to facilitate alignment and physical coupling of the server 12 and expansion chassis 56, as illustrated in FIG. 4. The addition of the expansion chassis 56 and various electronic components, such as those described below, convert or upgrade the server 12 to a server 14. Along similar lines, the server 12 may be considered a base configuration of a particular server and the server 14 may be considered an extended configuration of that particular server, as described above.

In one embodiment, the server 12 and the expansion chassis 56 have substantially the same form factor. In this instance, the addition of the expansion chassis 56 to the server 12 results in a server 14 having the same width and depth as the server 12 and twice the height, i.e., the server 14 occupies a space substantially similar to a pair of servers 12 stacked on top of one another. In other embodiments, the expansion chassis 56 may share one or two dimensions in common with the server 12, or may not share any of the same dimensions as server 12.

In the presently illustrated embodiment, expansion chassis 56 is secured to the server 12 via a plurality of screws 58 that are inserted through respective apertures 60 and secured to the clinch nuts 50. Screws 58 may be configured to be coupled to the nuts 50 through use of an appropriate tool, or may have a tool-free design, such as thumb screws. The exemplary chassis 56 also includes additional features that facilitate the receipt of electronic components and communication between those components and the server 12. For instance, the chassis 56 includes an aperture 62 that is configured to align with, and allow access to, the connector 42 of the server 12.

Figure 5:
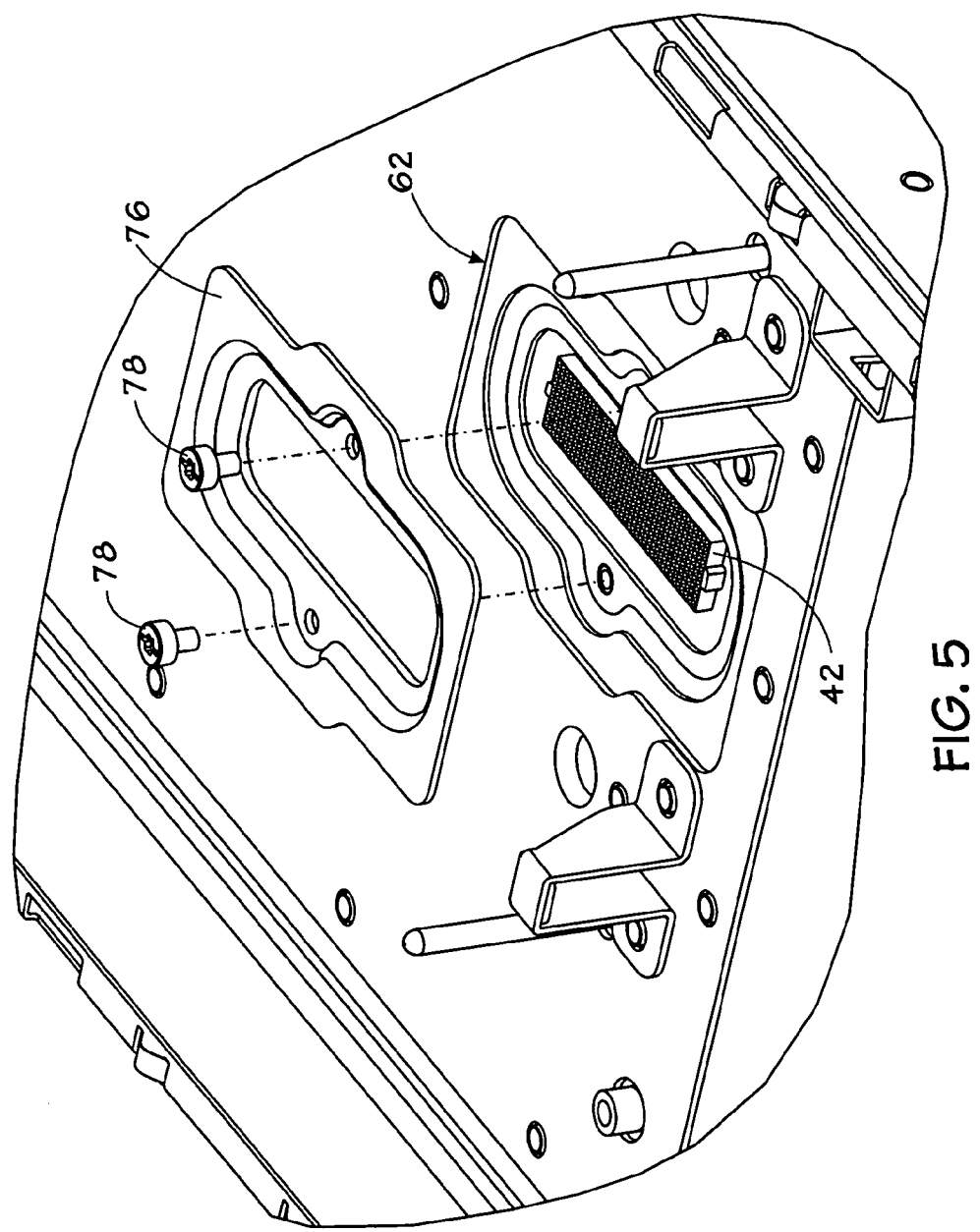
FIG. 5 is an exploded view illustrating the installation of an electromagnetic interference (EMI) shielding bracket to the assembly of FIG. 4 in accordance with one embodiment of the present invention.
Figure 6:
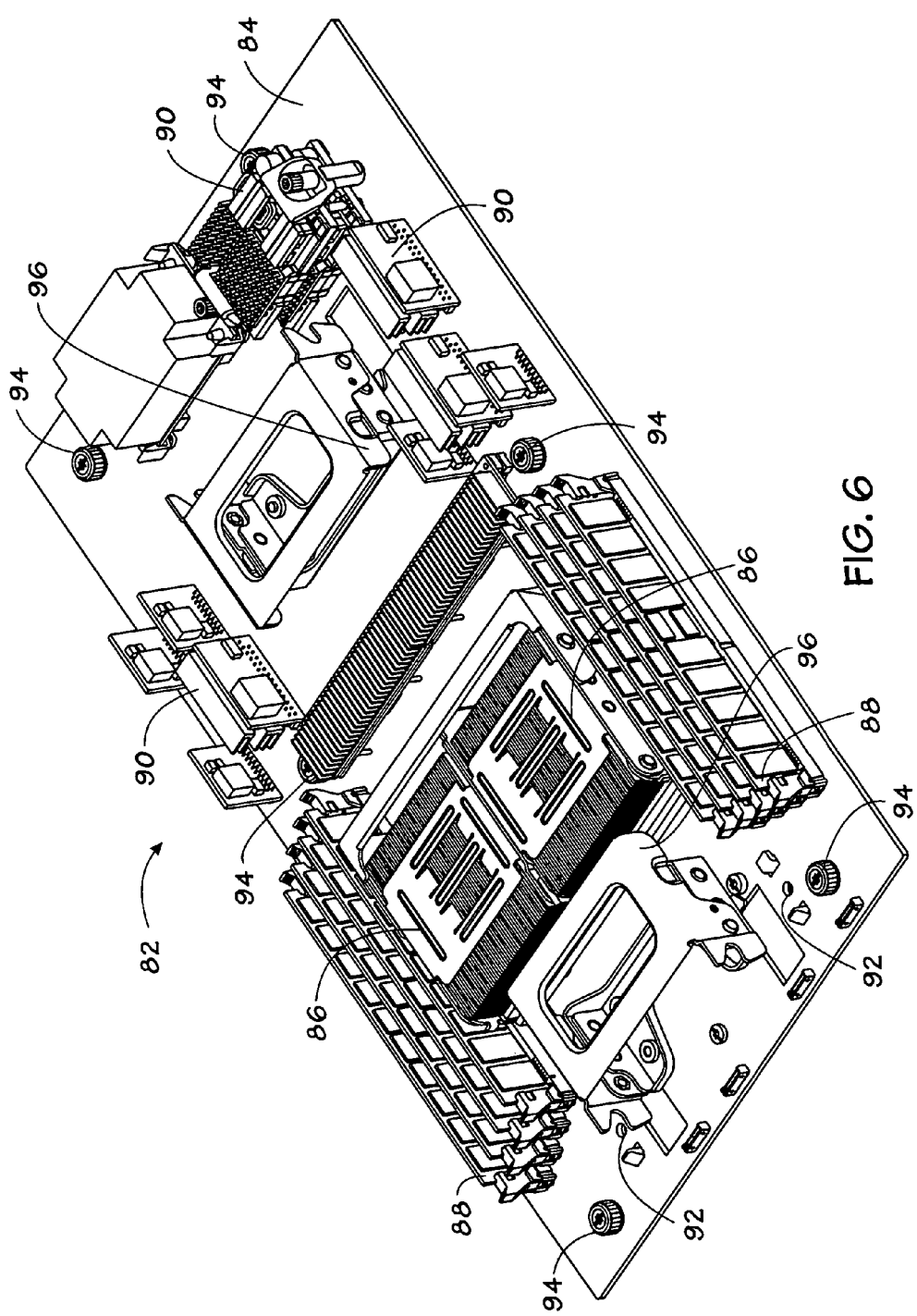
FIG. 6 is an upper perspective view of a printed circuit assembly having certain features that facilitate alignment and coupling of the printed circuit assembly to the expansion chassis of FIG. 4 in accordance with one embodiment of the present invention.

The chassis 56 also includes various securing and alignment features, such as brackets 64, guide pins 66, standoffs 68, and apertures 70, for receiving an expansion PCA, such as PCA 82 of FIG. 6. Further, the exemplary chassis 56 may also include additional mounting brackets 72, such as for receiving a fan assembly, and an aperture 74 to enable external powering of electronic components within the chassis 56. Additionally, an EMI shielding bracket 76 may be disposed in the aperture 62 adjacent the connector 42 and be secured to the server 12 via screws 78, as illustrated in FIG. 5.

Figure 7:
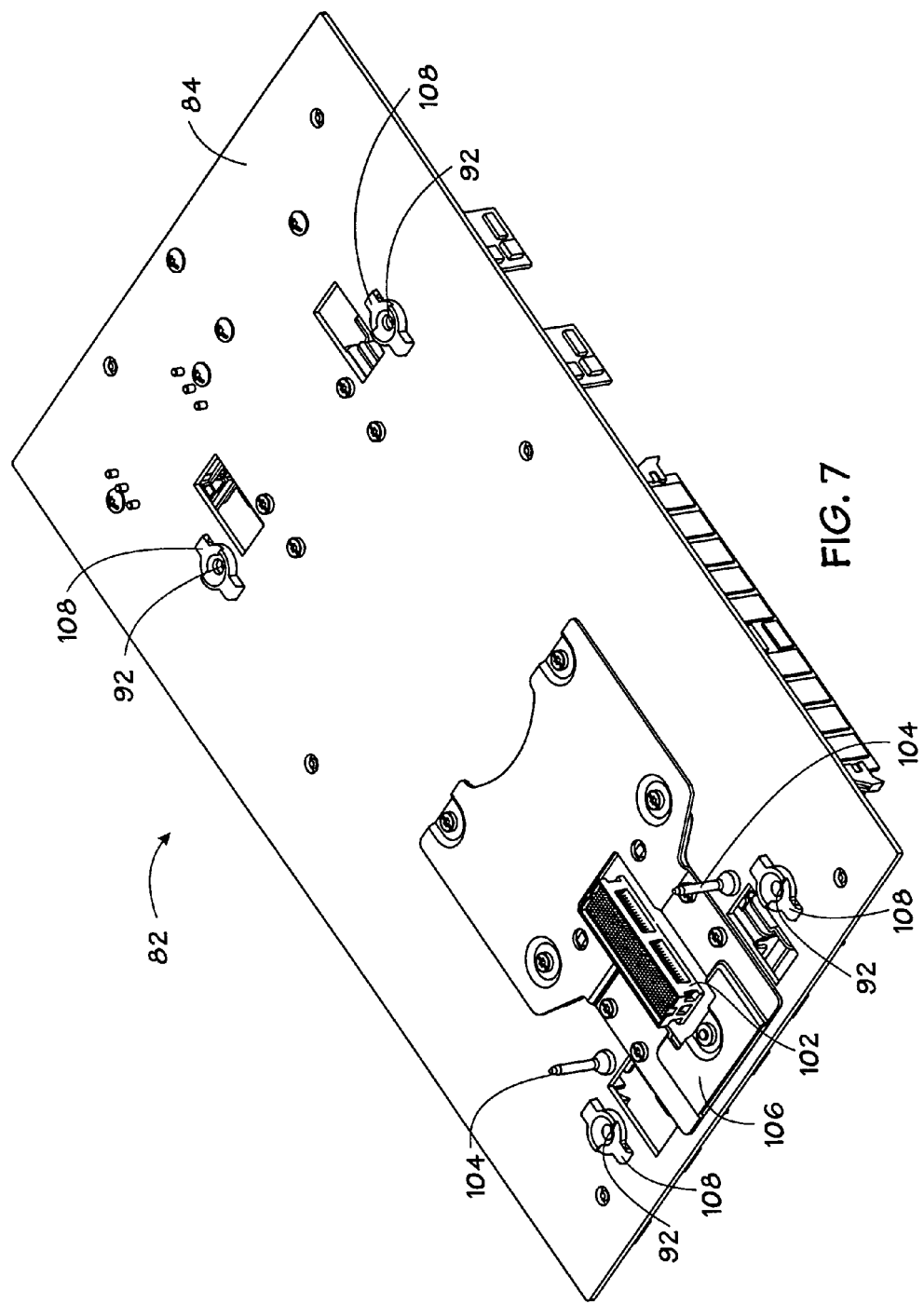
FIG. 7 is a lower perspective view of the printed circuit assembly of FIG. 6, illustrating additional alignment and coupling features in accordance with one embodiment of the present invention.

An exemplary PCA 82 that is configured to be disposed in the chassis 56 is illustrated in FIGS. 6 and 7. Particularly, FIGS. 6 and 7 illustrate upper and lower sides, respectively, of the exemplary PCA 82. In the present embodiment, the PCA 82 includes a variety of components and devices coupled to a printed circuit board (PCB) 84. The exemplary PCA 82 may include one or more processors 86, such as single-core or multi-core processors; one or more memory devices 88; other various components 90; or any combination thereof. In one embodiment, the PCA includes two processors 86 and is configured to upgrade a two-processor blade server 12 to a four-processor blade server 14.

The PCA 82 also includes one or more alignment or securing features to facilitate installation of the PCA 82 in the expansion chassis 56. For instance, the exemplary PCA 82 includes apertures 92 that are configured to receive the guide pins 66 (FIG. 4) and thumb screws 94 that are configured to cooperate with the standoffs 68 (FIG. 4) to secure the PCA 82 to the expansion chassis 56. Also, the PCA 82 includes handles 96 that are configured to rotate about an axis and cooperate with the brackets 64 (FIG. 4), as discussed in greater detail below. Turning to FIG. 7, the PCA 82 includes a scalability connector 102 that is configured to mate with the connector 42 (FIG. 4). The underside of the exemplary PCA 82 includes guide pins 104 that are configured to be received by the apertures 52 (FIG. 3) and the apertures 70 (FIG. 4). A backing plate 106 is also provided to reduce flexing of the PCB 84 during the installation process to avoid damage to the PCA 82. It should be noted that the PCB 38 (FIG. 2) may also include features to reduce flexing, such as a backing plate 106, a thumbscrew, or some other feature that reduces flexibility of the PCB 38 to facilitate proper mating of the PCBs 38 and 84 via the connectors 42 and 102. Additionally, tapered guide members or receiving brackets 108 are provided about apertures 92 to facilitate alignment of the guide pins 66 therewith.

It should be noted that various aligning, securing, and mounting features of the present apparatus, including the brackets 64 and 72, the guide pins 66 and 104, the standoffs 68, the handles 96, and the receiving brackets 108 may be formed of any number of suitable materials in accordance with the present techniques. Such materials include, among others, metal, plastic, ceramic, or any combination thereof. It should also be noted that while the presently described exemplary embodiment utilizes certain aligning and coupling features, other such features, including latches, hooks, loops, clips, mechanical snaps, and the like, may be used in place of, or in addition to, those illustrated in the present figures in full accordance with the present techniques.

Figure 8:
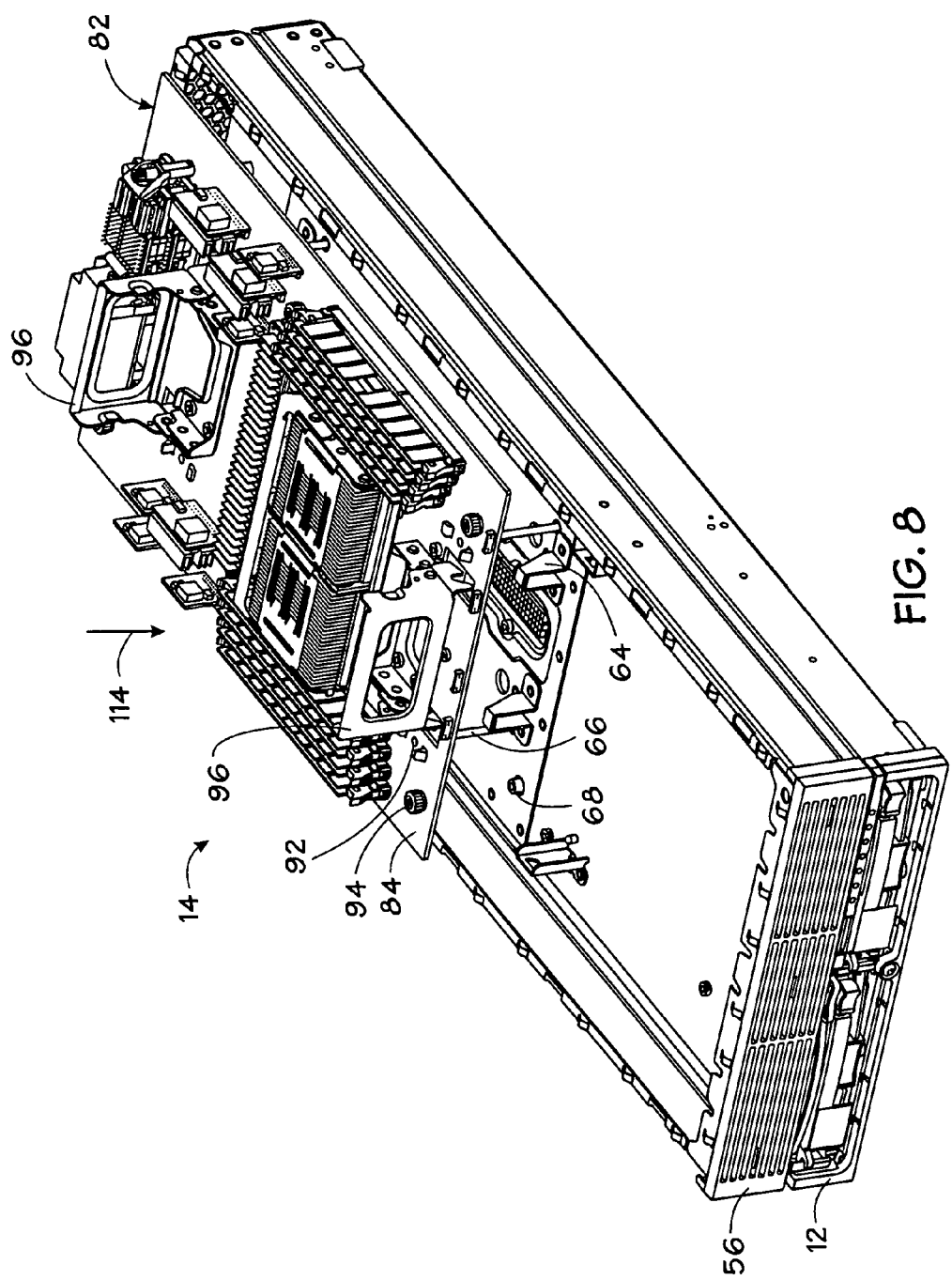
FIG. 8 is a perspective view depicting the installation of the printed circuit assembly in the expansion chassis of FIG. 4 in accordance with one embodiment of the present invention.

The PCA 82 may be installed in the chassis 56 as illustrated in FIG. 8. In this exemplary embodiment, the apertures 92 of the PCB 84 are aligned with the guide pins 66 and the PCA 82 is inserted into the chassis 56 in the direction indicated by arrow 114. As discussed in greater detail below with respect to FIGS. 9 and 10, once the PCA 82 is initially positioned in the chassis 56, the handles 96 may be rotated from an open position presently illustrated to a closed position (FIG. 10) to engage the brackets 64 and to physically and electrically couple the PCA 82 to the PCA 24 via the scalability connectors 42 and 102. In the present embodiment, the PCB 84 is installed substantially parallel to the PCB 38, although other arrangements are also envisaged. The PCA 82 may be further secured to the chassis 56 by screwing the thumb screws 94 into the standoffs 68.

Figure 9:
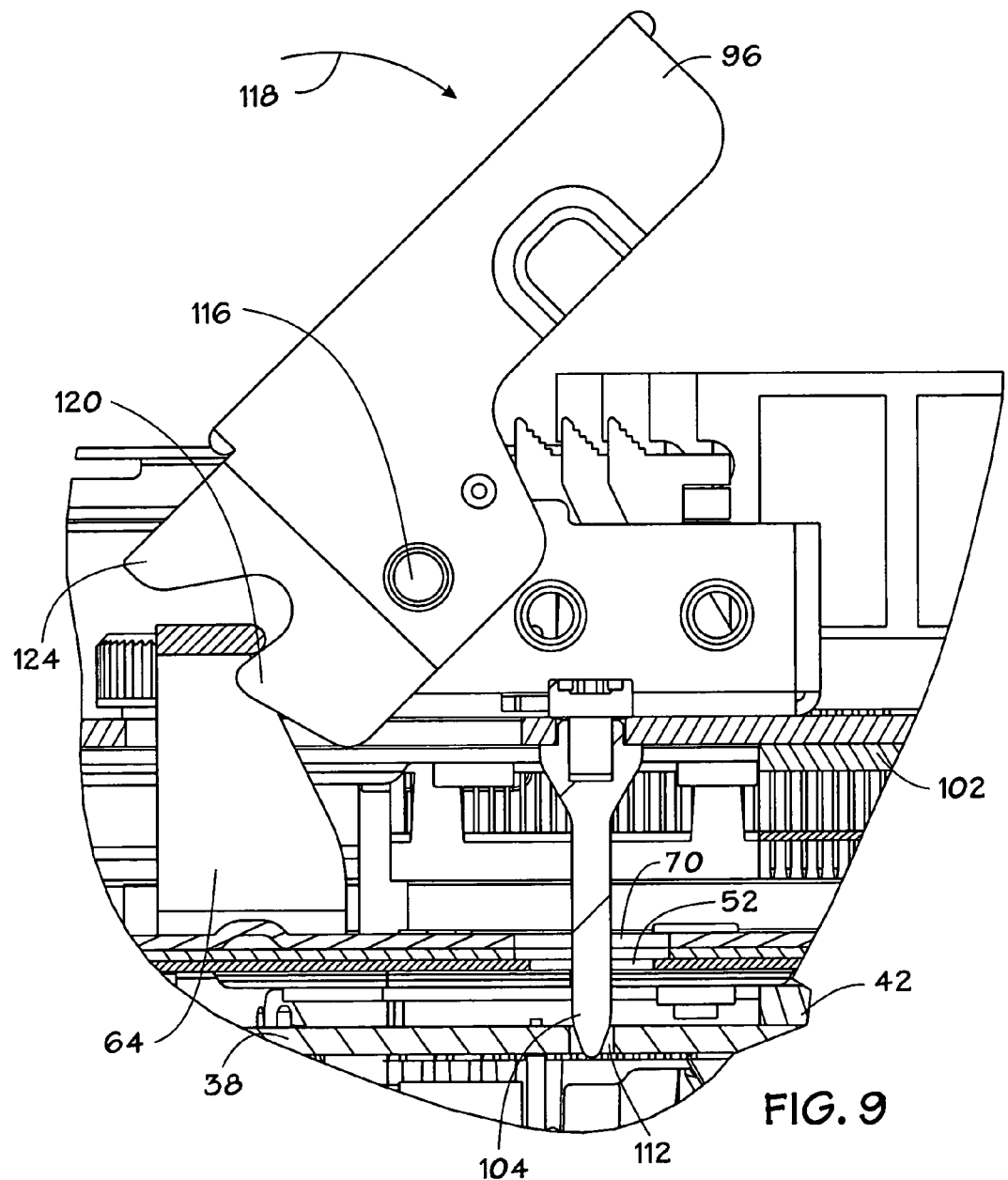
FIG. 9 is an offset sectional view illustrating the coupling of the printed circuit assembly to the expansion chassis via rotation of a handle of the printed circuit assembly from an open position to a closed position in accordance with one embodiment of the present invention.
Figure 10:
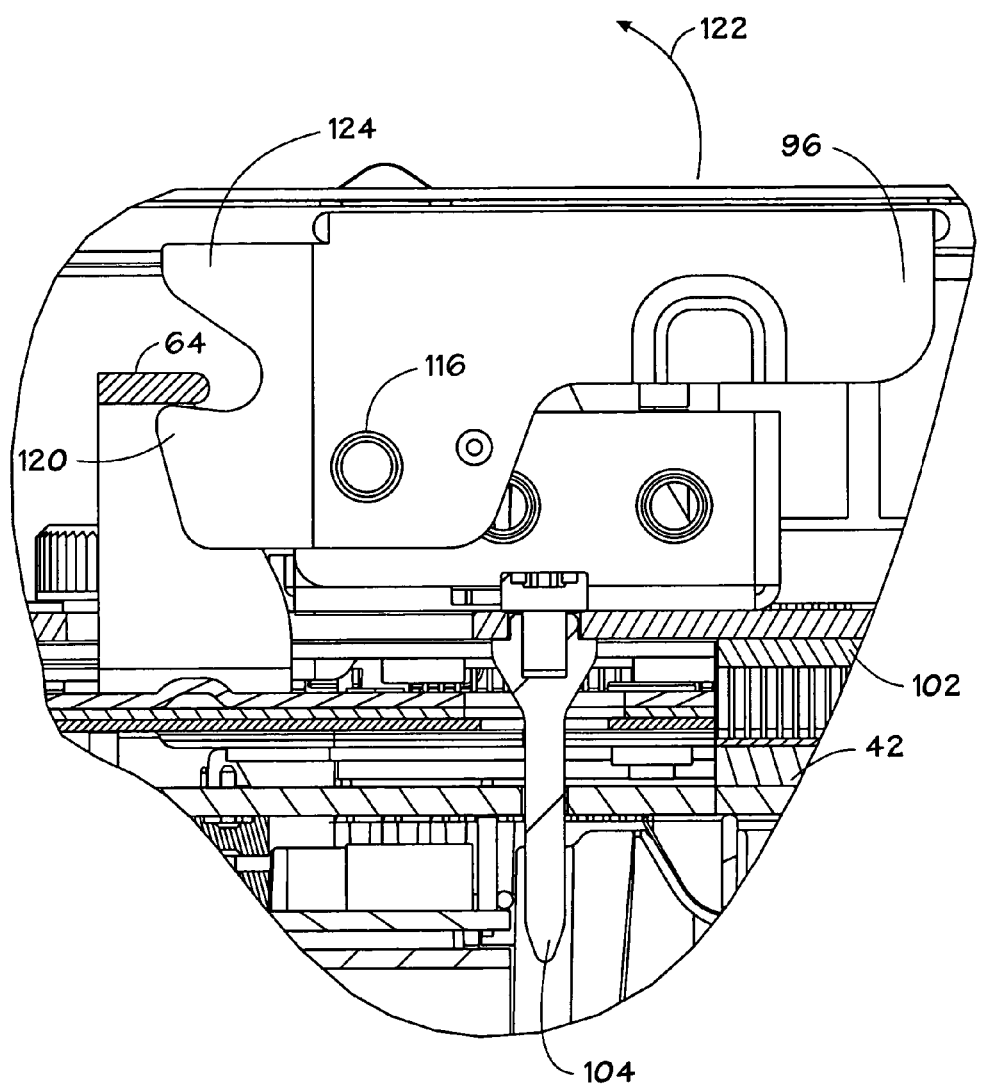
FIG. 10 is an offset sectional view illustrating the printed circuit assembly fully secured to the expansion chassis and the handle disposed in the closed position in accordance with one embodiment of the present invention.

FIGS. 9 and 10 illustrate the engagement of the connectors 42 and 102 through rotation of the handle 96. As the PCA 82 is initially positioned, the guide pins 104 are aligned with and inserted through apertures 52 and 70, as well as apertures 112 of the PCB 38 of the server 12. The handle 96 may be rotated about a pivot 116 in the direction indicated by arrow 118 from the open position (FIG. 8) to the closed position (FIG. 10). As the handle 96 is rotated in this direction, a locking portion 120 of the handle 96 engages the bracket 64. As the handle 96 is further rotated in the direction indicated by the arrow 118, the locking portion 120 acts as a cam in cooperation with the bracket 64, exerting a force on the PCB 84 to guide connectors 42 and 102 into engagement, as illustrated in FIG. 10.

Conversely, the handle 96 may be rotated in the direction indicated by arrow 122 to disengage the connectors 42 and 102. Particularly, as the handle 96 is rotated from the closed position to the open position, a release portion 124 of the handle 96 engages the bracket 64 to force PCB 84 away from the PCB 38, thereby disengaging the connector 102 from the connector 42. Consequently, the brackets 64, handles 96, and various alignment features facilitate full engagement of the connectors 42 and 102, while allowing selective installation and removal of the PCA 82 in an efficient manner that minimizes the potential for damage to the connectors resulting from misalignment of the PCA 82 with respect to the other components.

Figure 11:
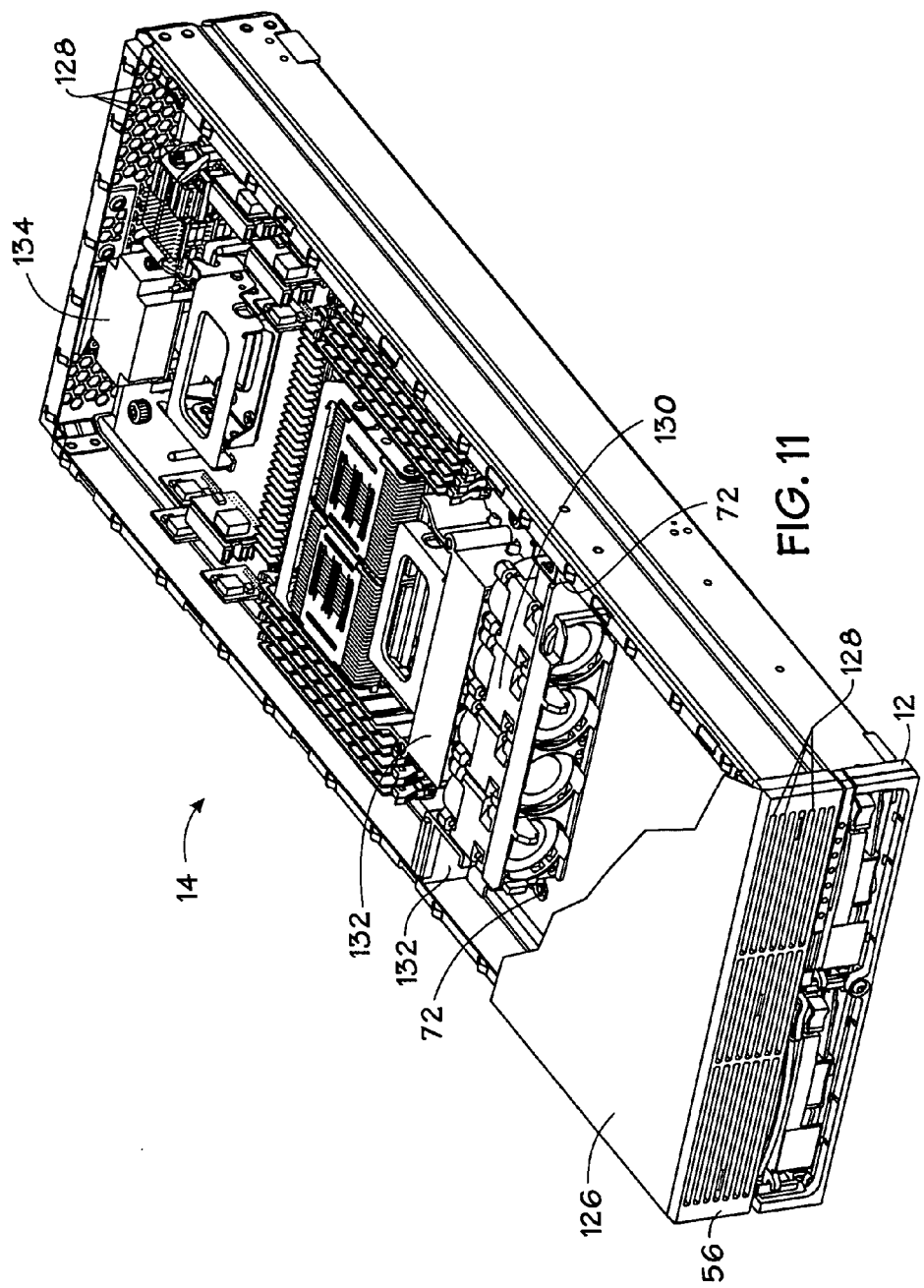
FIG. 11 is a perspective view of the modular computer server in an expanded configuration in accordance with one embodiment of the present invention.

Finally, an assembled exemplary server 14 is illustrated in FIG. 11. A hood or cover 126 may be secured to the expansion chassis 56 to enclose the PCA 82 therein. In the present illustration, however, a portion of the cover 126 is cut away, for the sake of clarity, to allow additional features of the server 14 to be depicted. As will be appreciated, the server 14 may be configured to facilitate heat dissipation. Accordingly, the exemplary server 14 includes a plurality of cooling vents or apertures 128, a fan assembly 130 installed via the brackets 72, and one or more air baffles 132 to direct airflow through the server 14. The server 14 may also include a variety of other components, such as an electric fuse or power converter 134 that is secured to the PCB 84 via mechanical snaps and configured to receive external power and distribute it to various components of the server 14.

While the present description has focused on the expansion of a server 12 through connection of one expansion chassis 56 and associated components, other configurations are also envisaged. For instance, in one embodiment, the server 12 may have multiple connectors disposed on multiple sides of the server 12 to facilitate coupling to a plurality of expansion chassis 56. In another embodiment, the expansion chassis 56 and related components may be configured to include one or more additional external connectors to enable further expansion of the assembly.

What is claimed is:
1. A modular system comprising:
   a computer server including:
      a first housing;
      a first printed circuit assembly disposed within the first housing; and
      a first expansion connector coupled to the first printed circuit assembly;
   wherein the computer server is configured to be physically and electrically coupled to a modular expansion unit external of the first housing to convert the computer server from a base configuration to an expanded configuration, the modular expansion unit comprising:
      a second housing configured to be mounted to the first housing;
      a second printed circuit assembly disposed within the second housing; and
      a second expansion connector coupled to the second printed circuit assembly and configured to cooperate with the first expansion connector to enable electrical communication between the first and second printed circuit assemblies;

wherein the second housing includes a guide pin configured to cooperate with an aperture of the second printed circuit assembly to facilitate installation of the second printed circuit assembly in the second housing.

2. The system of claim 1, wherein the first housing includes an aperture positioned proximate the first expansion connector and an aperture cover that is selectively removable to facilitate access to the first expansion connector via the aperture.

3. The system of claim 1, wherein the first housing comprises a first plurality of securing features configured to mate with a second plurality of securing features of the modular expansion unit.

4. The system of claim 1, comprising the modular expansion unit coupled to the computer server.

5. The system of claim 1, wherein the second printed circuit assembly includes a bracket disposed about the aperture and configured to facilitate alignment of the guide pin with the aperture.

6. The system of claim 4, wherein the second housing includes a first aperture that is aligned with a second aperture of the first housing of the computer server, and the first and second apertures are configured to receive a guide pin disposed on the second printed circuit assembly to facilitate alignment of the first and second expansion connectors with one another.

7. The system of claim 4, wherein the second printed circuit assembly includes a handle coupled to a printed circuit board, the handle configured to facilitate selective coupling and uncoupling of the second printed circuit assembly to and from the first printed circuit assembly via the first and second expansion connectors.

8. The system of claim 7, wherein the handle is configured to rotate in a first direction such that a first portion of the handle engages a securing bracket of the second housing to draw the second expansion connector into engagement with the first expansion connector.

9. The system of claim 8, wherein the handle is configured to rotate in a second direction such that a second portion of the handle engages the securing bracket to disconnect the first and second expansion connectors from each other.

10. The system of claim 7, wherein the second printed circuit assembly includes a support plate coupled to the printed circuit board at a location proximate the handle to reduce deformation of the printed circuit board during the selective coupling and uncoupling of the first and second printed circuit assemblies.

11. The system of claim 4, comprising a mounting structure for receiving the modular expansion unit and the computer server, wherein the mounting structure comprises at least one of a blade server cabinet or a server rack.

12. A modular device comprising:
an expansion chassis configured to be mounted to a housing of a computer server, the expansion chassis comprising a connector aperture and an alignment aperture spaced from the connector aperture;
a printed circuit assembly coupled to the expansion chassis;
a scalability connector connected to the printed circuit assembly and configured to be coupled through the connector aperture to a mating connector of the computer server to facilitate direct electrical communication between the printed circuit assembly and the computer server; and
a guide pin disposed on the printed circuit assembly, the guide pin extending through the alignment aperture of the expansion chassis and configured to extend through an aperture in the computer server to facilitate alignment of the scalability connector with the mating connector of the computer server.

13. The device of claim 12, wherein the computer server is a blade server having a first configuration, and the expansion chassis and printed circuit assembly of the modular device are configured to upgrade the blade server to a second configuration.

14. The device of claim 13, wherein the printed circuit assembly comprises a processor such that the second configuration has enhanced processing power with respect to the first configuration.

15. The device of claim 13, wherein the printed circuit assembly comprises a memory device such that the second configuration has a greater memory capacity than the first configuration.

16. A method of assembling a modular device, the method comprising:
providing a computer server, the computer server including a housing and a first circuit assembly disposed within the housing;
externally expanding the computer server with an expansion unit via mechanical and electrical connectors mating between the computer server and the expansion unit;
wherein externally expanding the computer server comprises:
securing a modular chassis to the exterior of the housing, the modular chassis configured to receive a second circuit assembly;
aligning at least one guide feature of the second circuit assembly with at least one mating feature of the modular chassis;
securing the second circuit assembly to the modular chassis;
electrically connecting the second circuit assembly to the first circuit assembly via first and second scalability connectors disposed on the first and second circuit assemblies, respectively; and
wherein securing the second circuit assembly comprises rotating a handle disposed on the second circuit assembly from a first position to a second position such that the handle engages a retaining feature of the modular chassis to effect electrical connection of the second circuit assembly to the first circuit assembly.

17. The method of claim 16, wherein the computer server is configured to operate independent of the second circuit assembly in a first configuration prior to connection of the second circuit assembly to the first circuit assembly, and to operate in cooperation with the second circuit assembly in a second configuration subsequent to connection of the second circuit assembly to the first circuit assembly.

18. The method of claim 16, comprising aligning the at least one guide feature of the second circuit assembly with at least one guide feature of the housing.

* * * * *

UNITED STATES PATENT AND TRADEMARK OFFICE
CERTIFICATE OF CORRECTION

| | | |
|---|---|---|
| PATENT NO. | : 7,589,974 B2 | Page 1 of 1 |
| APPLICATION NO. | : 11/408859 | |
| DATED | : September 15, 2009 | |
| INVENTOR(S) | : John R. Grady et al. | |

It is certified that error appears in the above-identified patent and that said Letters Patent is hereby corrected as shown below:

On the Title page, in field (73), Assignee, in column 1, line 1, delete "Helwett-Packard" and insert -- Hewlett-Packard --, therefor.

Signed and Sealed this

Ninth Day of November, 2010

David J. Kappos
*Director of the United States Patent and Trademark Office*